United States Patent
Dadras et al.

(10) Patent No.: US 10,538,165 B2
(45) Date of Patent: Jan. 21, 2020

(54) PARAMETER ESTIMATION OF LOOSELY COUPLED TRANSFORMER

(71) Applicant: FORD GLOBAL TECHNOLOGIES, LLC, Dearborn, MI (US)

(72) Inventors: Sara Dadras, Dearborn, MI (US); Hadi Malek, Dearborn, MI (US); Mohamed Elshaer, Canton, MI (US); Christopher W. Bell, Livonia, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 859 days.

(21) Appl. No.: 14/861,617

(22) Filed: Sep. 22, 2015

(65) Prior Publication Data
US 2017/0080814 A1    Mar. 23, 2017

(51) Int. Cl.
*G01R 27/08*    (2006.01)
*G01R 27/26*    (2006.01)
*B60L 11/18*    (2006.01)

(52) U.S. Cl.
CPC .......... *B60L 11/1829* (2013.01); *G01R 27/08* (2013.01); *G01R 27/2611* (2013.01)

(58) Field of Classification Search
CPC .... B60L 11/1829; B60L 11/182; G01R 27/08; G01R 27/2611; Y02E 60/12; H02J 7/025;
(Continued)

(56) References Cited

U.S. PATENT DOCUMENTS

| 2,741,738 A | * | 4/1956 | Reid ..................... | G01R 31/346 324/522 |
| 4,793,356 A | * | 12/1988 | Misic ..................... | G01R 33/341 324/318 |

(Continued)

FOREIGN PATENT DOCUMENTS

| DE | 3028027 A1 * | 2/1982 | ............. G01R 31/06 |
| WO | WO-2013051399 A1 * | 4/2013 | ............. H02J 17/00 |

(Continued)

OTHER PUBLICATIONS

Ribeiro, Maria Isabel, "Kalman and Extended Kalman Filters: Concept, Derivation and Properties", Institute for Systems and Robotics Instituto Superior Tecnico, Av. Rovisco Pais, 1, 1049-001 Lisboa Portugal (mir@isr.ist.utl.pt), 2004, 44 pages.

*Primary Examiner* — Richard Isla
*Assistant Examiner* — Mohammed J Sharief
(74) *Attorney, Agent, or Firm* — David Kelley; Brooks Kushman P.C.

(57) ABSTRACT

A parameter estimation system includes a first coil configured to be loosely inductively coupled to a second coil. A controller is programmed to output parameters of the first coil and second coil. The controller is programmed to estimate the parameters based on voltage and current measurement from only the first or the second coil. The voltage and current measurements may be used in a Kalman filter. In some configurations, the controller is further programmed to command a short circuit between terminals of the second coil and apply a test voltage to the first coil. The first coil may be part of a vehicle charging station and the second coil may be part of a vehicle. The parameters may be utilized to control charging of the vehicle.

18 Claims, 4 Drawing Sheets

(58) Field of Classification Search
CPC ........... H02J 5/005; H02J 17/00; H01F 38/14; Y02T 90/122
USPC .......................................... 320/108; 370/104
See application file for complete search history.

(56) References Cited

U.S. PATENT DOCUMENTS

| | | | | |
|---|---|---|---|---|
| 5,572,435 | A * | 11/1996 | Kaltenecker | H01F 41/02 |
| | | | | 716/110 |
| 2005/0046388 | A1 | 3/2005 | Tate, Jr. et al. | |
| 2005/0096874 | A1* | 5/2005 | Smiley | G01R 31/027 |
| | | | | 702/185 |
| 2007/0018741 | A1* | 1/2007 | Gabara | H03B 5/1841 |
| | | | | 331/177 V |
| 2010/0070219 | A1 | 3/2010 | Azancot et al. | |
| 2010/0161217 | A1 | 6/2010 | Yamamoto | |
| 2012/0053652 | A1* | 3/2012 | Dianaty | A61N 1/08 |
| | | | | 607/30 |
| 2012/0158325 | A1* | 6/2012 | Banerjee | G01R 29/20 |
| | | | | 702/58 |
| 2012/0181875 | A1* | 7/2012 | Wechlin | B60L 3/00 |
| | | | | 307/104 |
| 2012/0306265 | A1* | 12/2012 | Yamamoto | B60L 5/005 |
| | | | | 307/9.1 |
| 2013/0076306 | A1* | 3/2013 | Lee | H02J 7/025 |
| | | | | 320/108 |
| 2013/0119774 | A1* | 5/2013 | Ichikawa | B60L 11/123 |
| | | | | 307/104 |
| 2013/0329532 | A1* | 12/2013 | Sorias | G04C 10/00 |
| | | | | 368/64 |
| 2014/0015328 | A1 | 1/2014 | Beaver et al. | |
| 2015/0061578 | A1* | 3/2015 | Keeling | H02J 50/80 |
| | | | | 320/108 |
| 2015/0236526 | A1* | 8/2015 | Jadidian | H02J 5/005 |
| | | | | 320/108 |
| 2016/0052415 | A1* | 2/2016 | Bell | B60L 11/1833 |
| | | | | 320/108 |
| 2017/0030958 | A1* | 2/2017 | Zhang | G01R 31/027 |
| 2018/0205255 | A1* | 7/2018 | Ikefuji | H02J 7/025 |

FOREIGN PATENT DOCUMENTS

| | | | | |
|---|---|---|---|---|
| WO | WO 2015160616 A1 * | 10/2015 | ........... | G01R 31/027 |
| WO | WO-2015160616 A1 * | 10/2015 | | |

* cited by examiner

PARAMETER ESTIMATION OF LOOSELY
COUPLED TRANSFORMER

TECHNICAL FIELD

This application generally relates to a parameter estimation system for estimating parameters of loosely coupled transformers.

BACKGROUND

Loosely coupled (shunted) transformers have been used in the prior art in many settings and applications. For examples, to control current when power is supplied to various type of loads or in inductive wireless power transfer applications. Loosely coupled transformers have higher leakage reactance compared to standard transformers that are tightly coupled and their coupling coefficient is less than standard transformers. Loosely coupled transformers have an air gap between primary and secondary coils. Generally, an E-shaped or multi-legged magnetic core is employed with the air gapped legs. The type and geometry of the coils and cores can be different and depends on the application.

Characteristics of loosely coupled transformers can affect the performance of systems in which the loosely coupled transformers are applied. Depending on the application, these characteristics, including primary and secondary coils' self-inductances, mutual inductance between primary and secondary coils and primary and secondary coils' ESRs, have a significant influence on the system performance.

An example of loosely coupled transformers are in plug-in hybrid-electric vehicles (PHEV) and battery electric vehicles (BEV) which include a traction battery for powering the vehicle. The vehicle can be coupled to an external power source to charge the traction battery. The vehicle may support wireless charging of the traction battery. Wireless charging is accomplished by the use of coils in the charging system and the vehicle. Power is inductively transferred from the charging system to the vehicle through the coils. Alignment of the charging coils may be accomplished by a charge port in which a charge handle is inserted. Other systems may rely on the driver to align the charging coils. For example, the charging system may include a coil in the floor of a charge station. The vehicle may include a coil on an underside of the vehicle that may be in proximity to the floor coil when the vehicle is positioned in the charge station. Effectiveness of the charging may depend on the relative alignment of the coils.

SUMMARY

A transformer parameter estimation system includes a first coil configured to be inductively coupled to a second coil such that parameters characterizing the first coil and the second coil change for each coupling. The system further includes at least one controller programmed to output an estimate of the parameters to reduce an error between a measured first coil current and an estimated first coil current based on voltage and current measurements from only the first coil.

The at least one controller may be further programmed to command terminals of the second coil to be shorted and to apply a test voltage to the first coil. The at least one controller may be further programmed to perform the commanding and applying for a predetermined duration.

The at least one controller may be further programmed to output the estimate of the parameters based on a Kalman filter configured to use the voltage and current measurements to update the estimate of the parameters to reduce an error between the measured first coil current and an estimated first coil current that is derived from a model defined by the parameters. The parameters may include a mutual inductance between the first coil and the second coil. The parameters may include a resistance of the first coil and a self-inductance of the first coil. The parameters may include a self-inductance of the second coil and a resistance of the second coil.

A vehicle charging system includes a transmit coil and at least one controller programmed to, in response to detecting that a receive coil of a vehicle is in proximity to the transmit coil, command a short circuit between terminals of the receive coil, apply a test voltage to the transmit coil, and output parameters of the transmit coil and the receive coil based on voltage and current measurements from only the transmit coil.

The at least one controller may be further programmed to select an impedance value of a selectable impedance network coupled to the transmit coil based on the parameters to increase a transfer of energy from the transmit coil to the receive coil. The at least one controller may be further programmed to select an impedance value of a selectable impedance network coupled to the receive coil based on the parameters to increase a transfer of energy from the transmit coil to the receive coil. The parameters may include a mutual inductance between the transmit coil and the receive coil. The parameters may include a resistance of the transmit coil and a self-inductance of the transmit coil. The parameters may include a self-inductance of the receive coil and a resistance of the receive coil.

The at least one controller may be further programmed to command a positioning mechanism coupled to the transmit coil based on the mutual inductance. The test voltage may be a square wave having a magnitude less than a nominal charging voltage. The at least one controller may be further programmed to output the estimate of the parameters based on a Kalman filter configured to use the voltage and current measurements to update the estimate of the parameters to reduce an error between the measured transmit coil current and an estimated transmit coil current that is derived from a model defined by the parameters.

A method includes commanding, by a controller, a short circuit between terminals of a first coil. The method further includes applying a test voltage to a second coil loosely coupled to the first coil. The method further includes outputting, by the controller, an estimate of parameters of the first coil and the second coil to reduce an error between a measured second coil current and an estimated second coil current based on voltage and current measurements from only the second coil.

The estimate of parameters may include a self-inductance of the first coil and a self-inductance of the second coil. The method may further include filtering the voltage and current measurement using a Kalman filter configured to use the voltage and current measurements to update the estimate of the parameters to reduce an error between the measured second coil current and an estimated second coil current that is derived from a model defined by the parameters. The test voltage may be applied for a predetermined duration.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Loosely coupled coils that form a transformer are present in a variety of systems and applications. In the loosely coupled transformer, a first coil may act as a primary coil and a second coil may act as a secondary coil. An alternative voltage or current applied to the first coil induces a voltage and current in the second coil. An issue with loosely coupled coils is that the relative positioning of the coils may change each time the coils are coupled. The change in relative positioning causes parameters of the loosely coupled transformer to change. The change in parameters affects the voltage and current induced in the secondary coil. To improve performance of loosely coupled transformers, accurate knowledge of the parameters is beneficial. A transformer parameter estimation system may provide an estimate of the parameters so that performance may be improved.

Figure 1:
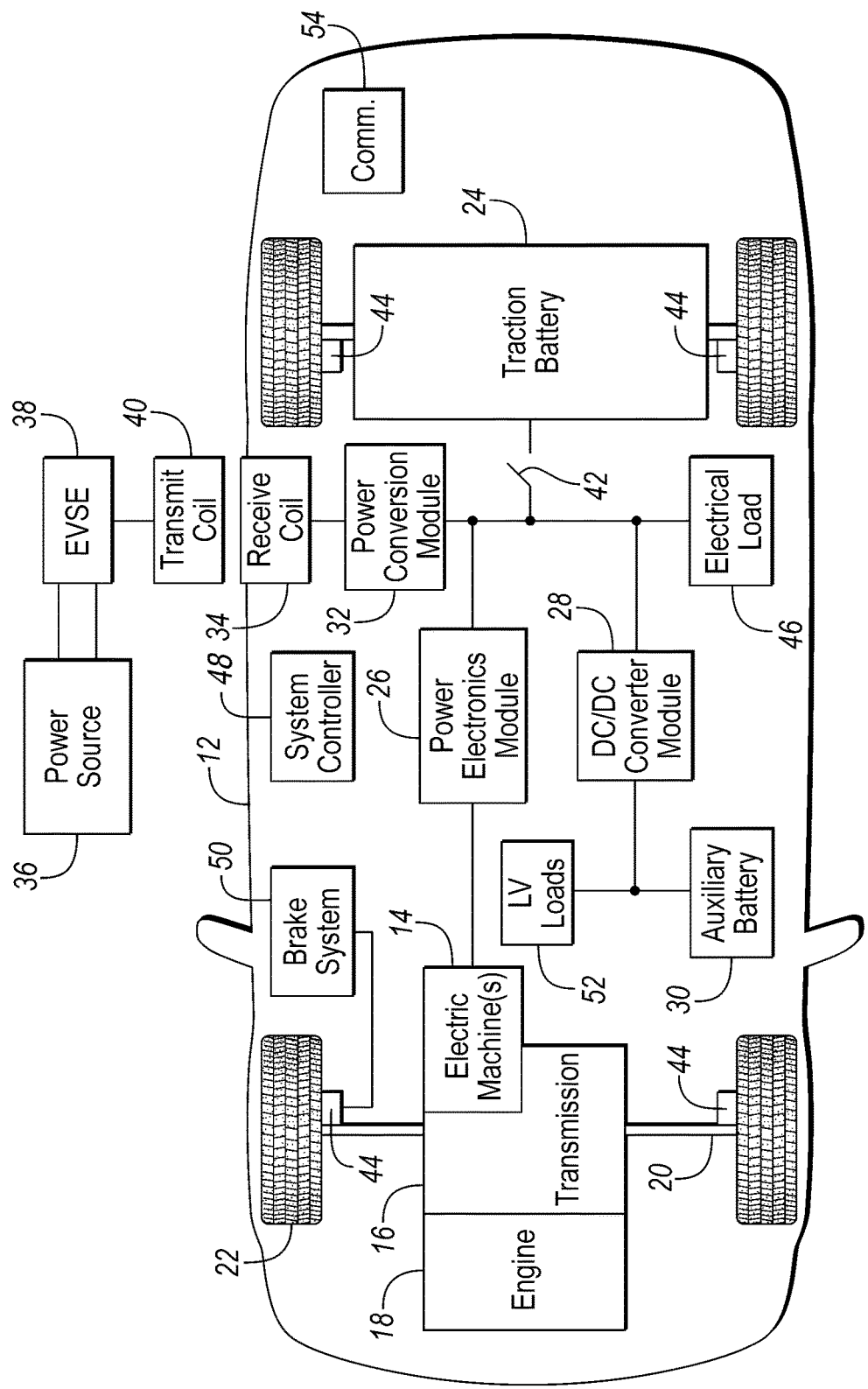
FIG. 1 is an example configuration of an electrified vehicle.

Although there are many application of the transformer parameter estimation system, the concepts may be understood by examining a wireless charging system for a vehicle. Note that the transformer parameter estimation system is not merely limited to vehicle charging applications. FIG. 1 depicts an electrified vehicle 12 that is typically referred to as a plug-in hybrid-electric vehicle (PHEV). A typical plug-in hybrid-electric vehicle 12 may comprise one or more electric machines 14 mechanically coupled to a hybrid transmission 16. The electric machines 14 may be capable of operating as a motor or a generator. In addition, the hybrid transmission 16 is mechanically coupled to an engine 18. The hybrid transmission 16 is also mechanically coupled to a drive shaft 20 that is mechanically coupled to the wheels 22. The electric machines 14 can provide propulsion and deceleration capability when the engine 18 is turned on or off. The electric machines 14 also act as generators and can provide fuel economy benefits by recovering energy that would normally be lost as heat in a friction braking system. The electric machines 14 may also reduce vehicle emissions by allowing the engine 18 to operate at more efficient speeds and allowing the hybrid-electric vehicle 12 to be operated in electric mode with the engine 18 off under certain conditions. An electrified vehicle 12 may include a battery electric vehicle (BEV). The BEV may not include the engine 18.

A traction battery or battery pack 24 stores energy that can be used by the electric machines 14. A vehicle battery pack 24 typically provides a high voltage DC output. The traction battery 24 is electrically coupled to one or more power electronics modules 26. One or more contactors 42 may isolate the traction battery 24 from other components when opened and connect the traction battery 24 to other components when closed. The power electronics module 26 is also electrically coupled to the electric machines 14 and provides the ability to bi-directionally transfer energy between the traction battery 24 and the electric machines 14. For example, a traction battery 24 may provide a DC voltage while the electric machines 14 may operate with a three-phase AC current. The power electronics module 26 may convert the DC voltage to a three-phase AC current to operate the electric machines 14. In a regenerative mode, the power electronics module 26 may convert the three-phase AC current from the electric machines 14 acting as generators to the DC voltage compatible with the traction battery 24.

In addition to providing energy for propulsion, the traction battery 24 may provide energy for other vehicle electrical systems. A vehicle 12 may include a DC/DC converter module 28 that converts the high voltage DC output of the traction battery 24 to a low voltage DC supply that is compatible with low-voltage vehicle loads 52. An output of the DC/DC converter module 28 may be electrically coupled to an auxiliary battery 30 (e.g., 12V battery). The low-voltage systems 52 may be electrically coupled to the auxiliary battery 30.

One or more high-voltage electrical loads 46 may be coupled to the high-voltage bus. The electrical loads 46 may have an associated controller that operates and controls the electrical loads 46 when appropriate. Examples of electrical loads 46 may be a fan, a heating element and/or an air-conditioning compressor.

The electrified vehicle 12 may be configured to recharge the traction battery 24 from an external power source 36. The external power source 36 may be a connection to an electrical outlet. The external power source 36 may be electrically coupled to a charger or electric vehicle supply equipment (EVSE) 38. The external power source 36 may be an electrical power distribution network or grid as provided by an electric utility company. The EVSE 38 may provide circuitry and controls to regulate and manage the transfer of energy between the power source 36 and the vehicle 12. The external power source 36 may provide DC or AC electric power to the EVSE 38.

The EVSE 38 may have one or more transmit coils 40 that are configured to be placed in proximity to one or more receive coils 34 of the vehicle 12. In some configurations, the receive coil 34 may be within a charge port configured to receive the transmit coil 40. In some configurations, the receive coil 34 may be located on an underside of the vehicle 12. In some configurations, the receive coil 34 may be located near an outer surface of the vehicle 12. The receive coil 34 may be electrically coupled to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12.

The off-board charging components include the power source 36, the EVSE 38 and the transmit coil 40. The off-board charging components may be part of a charging station. The transmit coil 40 may be configured in a stationary position. For example, the transmit coil 40 may be located on a surface of a parking area. When the vehicle 12 is parked in the parking area, the transmit coil 40 may come into proximity of the receive coil 34. In some configurations, the transmit coil 40 may be moveable to aid in aligning with the receive coil 34. The transmit coil 40 may be mounted to a mechanism that controls the position of the transmit coil 40 relative to the receive coil 34.

One or more wheel brakes 44 may be provided for decelerating the vehicle 12 and preventing motion of the vehicle 12. The wheel brakes 44 may be hydraulically actuated, electrically actuated, or some combination thereof. The wheel brakes 44 may be a part of a brake system 50. The brake system 50 may include other components to operate the wheel brakes 44. For simplicity, the figure depicts a single connection between the brake system 50 and one of the wheel brakes 44. A connection between the brake system 50 and the other wheel brakes 44 is implied. The brake system 50 may include a controller to monitor and coordinate the brake system 50. The brake system 50 may monitor the brake components and control the wheel brakes 44 for vehicle deceleration. The brake system 50 may respond to driver commands and may also operate autonomously to implement features such as stability control. The controller of the brake system 50 may implement a method of applying a requested brake force when requested by another controller or sub-function.

Electronic modules in the vehicle 12 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 30. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 12. A vehicle system controller (VSC) 48 may be present to coordinate the operation of the various components.

The vehicle 12 may include a wireless communications module 54 to communicate with devices and systems remote from the vehicle 12. The wireless communications module 54 may include an onboard modem having an antenna to communicate with off-board devices or systems. The wireless communications module 54 may be a cellular communications device to enable communications via a cellular data network. The wireless communications module 54 may be a wireless local area network (LAN) device compatible with IEEE 802.11 family of standards (i.e., WiFi) or a WiMax network. The wireless communications module 54 may include a vehicle based wireless router to allow connection to remote networks in range of a local router. The wireless communications module 54 may interface with one or more controllers (e.g., 48) in the vehicle 12.

An inductive or wireless charging system may utilize the one or more transmit coils 40 in the EVSE and the one or more receive coils 34 in the vehicle 12 to transfer energy to the vehicle 12. Operation of the wireless charging system may proceed when the transmit coil 40 and the receive coil 34 are in proximity with one another. In some configurations, the operator of the vehicle 12 may position the transmit coil 40 into the charge port that is configured to align the transmit coil 40 with the receive coil 34. In some configurations, the transmit coil 40 may be in a fixed location of a charging station. The receive coil 34 may be positioned by moving the vehicle 12 within the charging station. In many configurations, the alignment of the transmit coil 40 relative to the receive coil 34 may vary. The loosely coupled transmit coil 40 and receive coil 34 may be modeled as a transformer defined by a plurality of parameters. Different alignments of the transmit coil 40 and the receive coil 34 may cause differences in the values of the transformer parameters.

Figure 2:
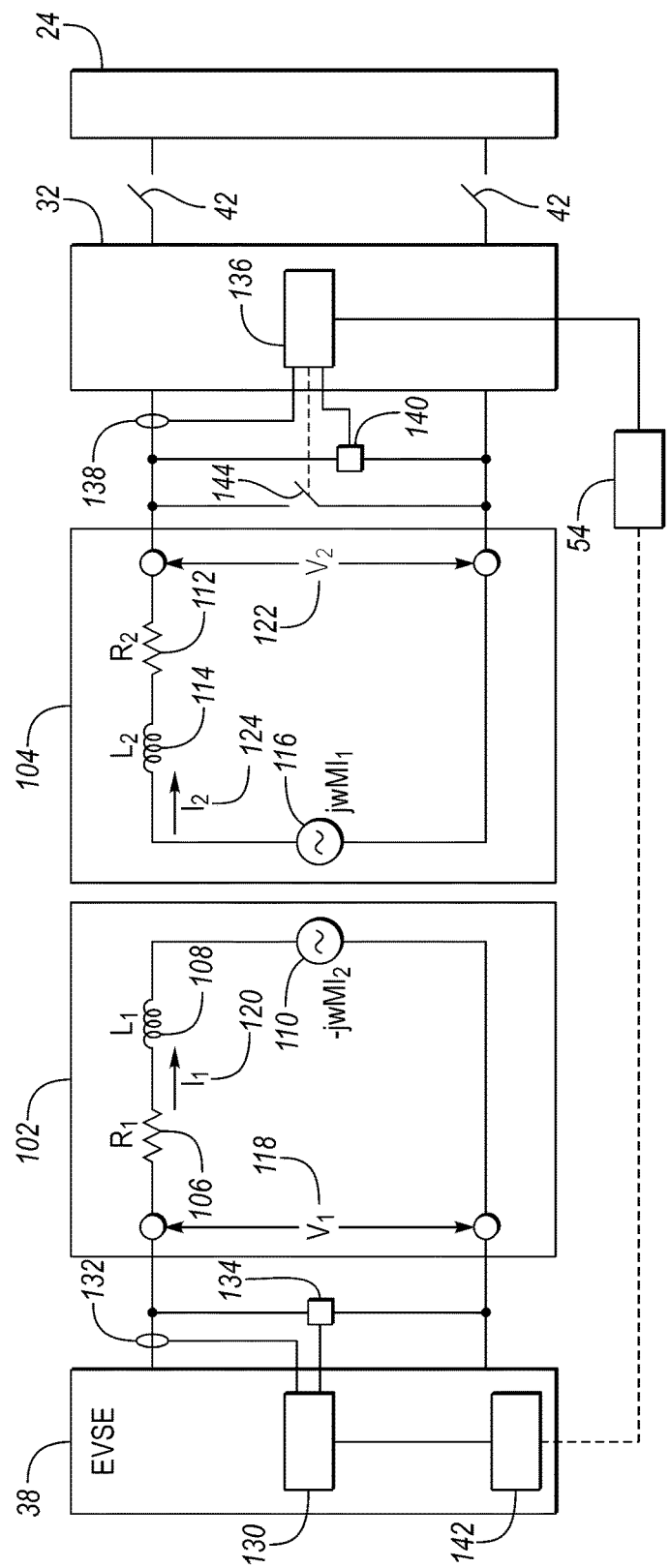
FIG. 2 is an example configuration of a vehicle charging system and model.

The wireless charging system may be modeled as a circuit that includes a transformer. The transformer may be modeled using resistors, inductors, and voltage sources. FIG. 2 depicts one possible configuration of the transformer parameter estimation system as applied to a wireless charging system for a vehicle. FIG. 2 further depicts a circuit diagram of a possible transformer model. The transformer model includes a primary-side circuit 102 and a secondary-side circuit 104. The primary-side circuit 102 represents the transmit coil 40. The secondary-side circuit 104 represents the receive coil 34 in the vehicle 12. The primary-side circuit 102 may be coupled to the EVSE 38 and the power source 36 to transfer energy. An input to the primary-side circuit 102 may be a primary input voltage, $V_1$ 118. The primary input voltage 118 may be an alternating current (AC) voltage that is controlled by the EVSE 38. Flowing through the primary-side circuit 102 may be a primary current, $I_1$ 120. The primary current 120 represents current flowing through the transmit coil 40. An output of the secondary-side circuit 104 may be a secondary output voltage, $V_2$ 122. Flowing through the secondary-side circuit 104 may be a secondary current, $I_2$ 124. The secondary current 124 represents the current flowing through the receive coil 34. The output of the secondary-side circuit 104 may be coupled to the traction battery 24.

A transmit coil voltage measurement circuit 134 may be coupled across terminals of the transmit coil 40 (represented by the primary-side circuit 102) to facilitate measuring the voltage applied. A transmit coil current measurement sensor 132 may be coupled to the transmit coil 40 to measure the transmit coil current 120. The EVSE 38 may include a controller 130 that is configured to measure the transmit coil voltage 118 and the transmit coil current 120. Output signals from the transmit coil voltage measurement circuit 134 and the transmit coil current measurement sensor 132 may be coupled to controller 130.

A receive coil voltage measurement circuit 140 may be coupled across output terminals of the receive coil 34 (represented by the secondary-side circuit 104) to facilitate measuring the output voltage. A receive coil current measurement sensor 138 may be coupled to the receive coil 34 to measure the receive coil current 124. The vehicle 12 may include a vehicle charge controller 136 that is configured to measure a receive coil voltage 122 and a receive coil current 124. In some configurations, the vehicle charge controller 136 may be part of the Power Conversion Module 32. Output signals from the receive coil voltage measurement circuit 140 and the receive coil current measurement sensor 138 may be coupled to vehicle charge controller 136. The controllers 130, 136 may include appropriate scaling and filtering circuitry to provide accurate voltage and current measurements. The controllers 130, 136 may also include peak detection circuitry or other circuitry to convert AC signals to direct current (DC) signals. The controllers 130, 136 may include one or more Analog-to-Digital Converters (ADC) to convert the analog values to digital values.

The primary-side circuit 102 of the transformer model 100 includes a series connection of a primary resistance, $R_1$ 106, a primary inductance, $L_1$ 108, and a secondary current dependent voltage generator 110. The secondary-side circuit 104 includes a series connection of a secondary resistance, $R_2$ 112, a secondary inductance, $L_2$ 114, and a primary current dependent voltage generator 116. Parameters of the charging system include the primary resistance, $R_1$ 106, the secondary resistance, $R_2$ 112, the primary inductance, $L_1$ 108, the secondary inductance, $L_2$ 114, and mutual inductance, M, that affects the gain of the current dependent voltage generators 110, 116.

The voltages, $V_1$ and $V_2$, of the transformer model may be expressed as:

$$V_1 = j\omega L_1 I_1 + R_1 I_1 + j\omega M I_2 \quad (1)$$

$$V_2 = j\omega M I_1 - j\omega L_2 I_2 - R_2 I_2 \quad (2)$$

Note that the primary-side circuit 102 is dependent upon the secondary current 124 and the secondary-side circuit 104 is dependent upon the primary current 120.

The current dependent voltage sources 110, 116 model the energy transfer of the transformer. In the secondary-side circuit 104, the primary current dependent voltage generator 116 may act as an input. The voltage induced in the secondary-side circuit 104 may be further based on the frequency, w, of the applied voltage 118 and the mutual inductance, M, of the transformer.

The primary current 120 and the secondary current 124 may be computed by applying a Laplace transform to equations (1) and (2). The resulting expressions are:

$$I_1(s) = \frac{R_2 V_1 + L_2 V_1 s - M V_2 s}{R_1 R_2 + M^2 s^2 + L_1 R_2 s + L_2 R_1 s - L_1 L_2 s^2} \quad (3)$$

$$I_2(s) = -\frac{R_1 V_2 + L_1 V_2 s - M V_1 s}{R_1 R_2 + M^2 s^2 + L_1 R_2 s + L_2 R_1 s - L_1 L_2 s^2} \quad (4)$$

Both $I_1$ and $I_2$ depend on the output voltage, $V_2$. In some configurations, the output voltage $V_2$ may be a high voltage level. The additional cost of the voltage sensor to measure the high voltage level may increase overall vehicle cost. In some configurations, the measurement of the output voltage $V_2$ may be eliminated by installing a switching element 144 across the output of the secondary-side circuit 104. When the switching element 144 is in a closed position, the voltage $V_2$ may be zero. By closing the switching element 144, references to $V_2$ in equations (3) and (4) may be set to zero. Some configuration may include a voltage sensor for the output voltage $V_2$ in which case equations (3) and (4) may be used directly.

The switching element 144 may be a relay or a solid-state switching device that is coupled to the vehicle charge controller 136. The vehicle charge controller 136 may be configured to drive the switching element 144 to the opened and closed position. The vehicle charge controller 136 may include appropriate interface circuitry to drive the switching element 144 at proper voltage and current levels for the selected device.

When the switching element 144 is in the closed position, equations (3) and (4) may be simplified as:

$$\frac{I_1}{V_1} = \frac{R_2 + L_2 s}{R_1 R_2 + M^2 s^2 + L_1 R_2 s + L_2 R_1 s - L_1 L_2 s^2} \quad (5)$$

$$\frac{I_2}{V_1} = \frac{M V_1 s}{R_1 R_2 + M^2 s^2 + L_1 R_2 s + L_2 R_1 s - L_1 L_2 s^2} \quad (6)$$

Equations (5) and (6) may be expressed in general discretized form as follows:

$$\frac{I_1}{V_1}, \frac{I_2}{V_1} = \frac{a_2 + a_1 z^{-1} + a_0 z^{-2}}{b_2 + b_1 z^{-1} + b_0 z^{-2}} \quad (7)$$

where z represents a delay operator.

For configurations in which $V_1$ and $I_1$ are measured for the function $I_1/V_1$, the a and b coefficients for equation (7) may be computed as follows:

$$a_0 = R_2 T^2 - 2L_2 T \quad (8)$$

$$a_1 = 2R_2 T^2 \quad (9)$$

$$a_2 = R_2 T^2 + 2L_2 T \quad (10)$$

$$b_0 = 4L_1 L_2 - 4M^2 - 2T(L_1 R_2 + L_2 R_1) + R_1 R_2 T^2 \quad (11)$$

$$b_1 = 8M^2 + 2R_1 R_2 T^2 - 8L_1 L_2 \quad (12)$$

$$b_2 = 2T(L_1 R_2 + L_2 R_1) - 4M^2 + 4L_1 L_2 + R_1 R_2 T^2 \quad (13)$$

where T is the sampling time of the measured currents and voltages.

For configurations in which V2 and I2 are measured for the function $I_2/V_1$, the b coefficients for equation (7) are also expressed as equations (11)-(13) and the a coefficients are:

$$a_0 = -2MT \quad (14)$$

$$a_1 = 0 \quad (15)$$

$$a_2 = 2MT \quad (16)$$

Equations (7) through (16) provide a discrete-time model for the currents as a function of the primary-side circuit input voltage 118. The currents may be computed, provided that the transformer parameters are known. In a stationary transformer application in which neither coil moves relative to the other, knowledge of the parameters may be known and fixed in advance. However, in a vehicle charging application, the transmit coil 40 and the receive coil 34 may misaligned relative to one another. Each charging session may result in a different relative coil placement. Therefore, fixed parameter values may not be effective for operating the charging system. A better approach may be to estimate the parameter values each time charging is to be initiated.

Figure 4:
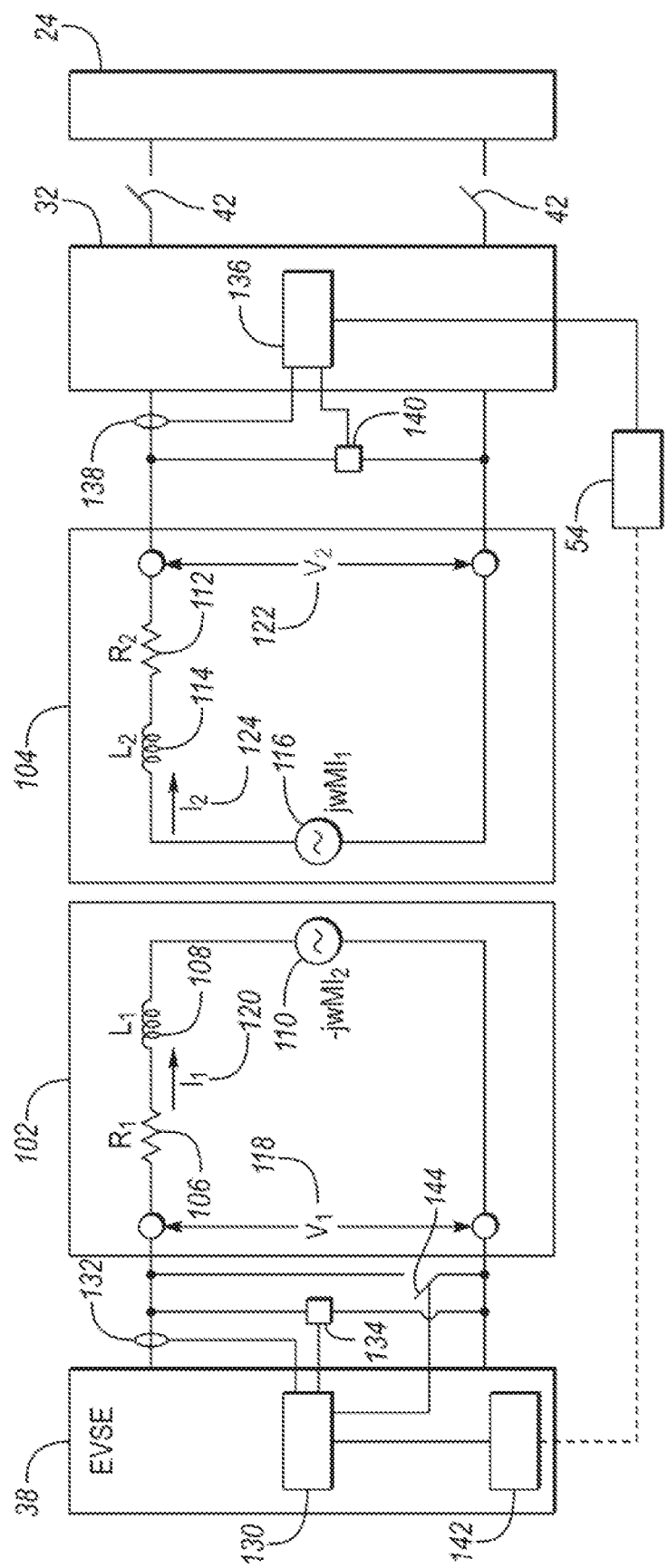
FIG. 4 is a second example configuration of the vehicle charging system and model

In other configurations, the switching element 144 may be placed across the transmit coil 40 and coupled to the EVSE controller 130 for control (as shown in FIG. 4). In this configuration., the roles of the transmit coil. 40 and the receive coil 34 may be reversed. Note that in this case, the voltage $V_1$ is zero and equations (3) and (4) must be updated accordingly. The remaining equations are derived in a similar manner.

One method to estimating system parameters is to utilize a Kalman filter. For computing $I_1$, equations (7)-(13) may be expressed as:

$$a_0 V_1(k-2) + a_1 V_1(k-1) + a_2 V_1(k) = b_0 I_1(k-2) + b_1 I_1(k-1) + b_2 I_1(k) \quad (17)$$

where, in general for a function "f", f(k) denotes a present sample of the function and f(k-n) denotes the sample of the function n sample periods prior to the present sample. Equation (17) may be solved for $I_1$ to yield:

$$I_1(k) = \frac{a_2}{b_2} V_1(k-2) + \frac{a_1}{b_2} V_1(k-1) + \frac{a_0}{b_2} V_1(k) - \frac{b_0}{b_2} I_1(k-2) - \frac{b_1}{b_2} I_1(k-1) \quad (18)$$

A Kalman filter recursive parameter estimation can be achieved by expressing equation (18) in the form:

$$Y(k) = \Phi^T(k) * \Theta(k) \quad (19)$$

where Y is the system output, $\Phi$ is referred to as the regressor, and $\Theta$ is the parameter vector.

The parameter vector, $\Theta$, and the regressor, $\Phi$, may be expressed as:

$$\Theta = \begin{bmatrix} a_2/b_2 \\ a_1/b_2 \\ a_0/b_2 \\ b_0/b_2 \\ b_1/b_2 \end{bmatrix}, \quad (20)$$

$$\Phi^T = [V_1(k-2) \quad V_1(k-1) \quad V_1(k) \quad -I_1(k-2) \quad -I_1(k-1)]$$

One possible Kalman filter estimation scheme may be expressed by the following equations:

$$\hat{\Theta}(k+1) = \hat{\Theta}(k) + K(k) * (Y(k+1) - \Phi^T(k) * \hat{\Theta}(k)) \quad (21)$$

$$K(k+1) = Q(k+1) * \Phi(k+1) \quad (22)$$

$$Q(k+1) = \frac{P(k)}{R_2 + (\Phi^T(k+1) * P(k) * \Phi(k+1))} \quad (23)$$

$$P(k+1) = P(k) + R_1 - \frac{P(k) * \Phi(k) * \Phi^T(k) * P(k)}{R_2 + (\Phi^T(k+1) * P(k) * \Phi(k+1))} \quad (24)$$

where $\hat{\Theta}(k+1)$ is the estimate of the parameters, Y(k+1) is the measured primary circuit current, K, Q, and P are calculated as shown, and $R_1$ and $R_2$ are constants. After the parameters are calculated using the Kalman filter algorithm, the parameters can be used for other computations. Other parameter estimation schemes, such as least-squares estimation, may also be utilized. Other implementations of a Kalman filter are possible. In some configurations, different regressor and parameter vectors may be chosen.

The regressor is comprised of measured and stored values of the primary voltage and primary current. The parameter vector may be estimated using the Kalman filter. Once the parameters are estimated, the individual values may be used to solve equations (8)-(13) for the parameter values. The estimated parameter values in terms of a and b coefficients may be expressed in terms of the model parameters by substituting the appropriate equations (8)-(13) for the coefficients. This results in a final set of equations in terms of the model parameters and the estimated values that may then be solved for the model parameters. The Kalman filter described may be implemented in the EVSE controller 130.

The Kalman filter operates to reduce an error between a measured transmit coil current (Y) and an estimated transmit coil current ($\Phi^T * \hat{\Theta}$) that is derived from a model defined by the parameters. The error is used to update the parameter estimates. Over time, the parameter estimates may converge to final values such that the error is driven to approximately zero.

In some configurations, it may be desired to estimate only the mutual inductance, M. This simplification assumes that values for the resistances and inductances are known in advance. In this configuration, the resistance and inductance values may be inserted into the equations. The parameter vector and regressor may be adjusted to reflect the known values. The result may be a reduced number of equations to solve leading to a reduction of computational resources.

In the vehicle application, the charge system identification mode may be performed with the contactors 42 in the open position so that the traction battery 24 is isolated from the secondary-side circuit 104. The vehicle charge controller 136 may be powered from energy stored in the auxiliary battery 30. The vehicle charge controller 136 may be coupled to the switching element 144 to control the state of the switching element 144. The vehicle charge controller 136 may also be coupled to the contactors 42 to facilitate control of the contactors 42 during the identification mode. During normal operation of the vehicle 12, the switching element 144 may be in the opened position to prevent shorting the traction battery 24. The switching element 144 may be placed in the closed position during the charge system identification mode. Once the parameters have been identified and output, the switching element 144 may be opened and the contactors 42 closed. Normal charging of the traction battery 24 may be initiated after parameter identification.

The EVSE controller 130 and the vehicle charge controller 136 may be in communication to coordinate the charge system identification mode. The EVSE 38 may include a wireless communication interface 142 that is configured to establish a wireless communication channel with the wireless communication module 54 of the vehicle 12. Control data and information may be exchanged between the EVSE controller 130 and controllers in the vehicle 12 including the vehicle charge controller 136. The EVSE controller 130 may communicate the transformer parameter values to the vehicle charge controller 136.

The vehicle 12 may further include a selectable secondary-side impedance matching network coupled to the receive coil 34. The EVSE 38 may further include a selectable primary-side impedance matching network coupled to the transmit coil 40. The impedance matching networks may include variable resistances and/or capacitors to aid in matching the impedances between the transmit coil 40 and the receive coil 34. Based on the parameters identified for the transformer model, the selectable impedance may be selected for one or both of the transmit coil 40 and the receive coil 34. The impedance may be selected to maximize energy transferred from the transmit coil 40 to the receive coil 34. The impedance value may be selectable from control signals from one or more of the controllers.

For the identification to take place, a test voltage may be applied to the transmit coil 40. The test voltage may be a pulsed voltage or square wave at a predetermined frequency to excite the system to allow for improved parameter identification. The identification may be performed until the error between the estimated current and actual measured current is less than a predetermined error. The test voltage may also be applied for a predetermined duration. A magnitude of the test voltage may be less than a typical charging voltage magnitude.

The charge system identification mode may be entered under certain conditions. One possible condition is upon the vehicle 12 entering the charge station and initiating a charge cycle. Another condition may be an operator physically plugging the inductive charge coupler into the vehicle charge port. In some configurations, the charge station and the vehicle 12 may communicate via a wireless network connection. The charge system identification mode may be entered when the transmit coil 40 is in proximity to the receive coil 34. The controllers may receive signals indicative of the transmit coil 40 being in proximity to the receive coil 34. For example, a charge port may provide signal when a charge plug is inserted. Further, the controllers 130, 136 may establish wireless communication when the vehicle 12 is in proximity of the charge station.

The transformer parameter values may be used to determine the relative position of the transmit coil 40 to the receive coil 34. Predetermined parameter values may be known for an optimal position of the transmit coil 40 relative to the receive coil 34. The transformer parameters may be compared to the predetermined parameter values to determine if the transmit coil 40 may be better positioned relative to the receive coil 34. In some configurations, the battery charging system may include a positioning mechanism for the transmit coil 40 or receive coil 34. The positioning mechanism may be configured to change the relative positioning of the coils to improve performance of the charging system. The transmit coil 40 may be positioned based on the estimated mutual inductance value or differences between the estimated transformer parameter values and the predetermined parameter values.

The transformer parameter values may be used to improve the efficiency of the vehicle charging process. It may be desired to match impedances between the transmit coil 40 and the receive coil 34. The charging system may include a selectable impedance network that is couple to the transmit coil 40 and/or the receive coil 34. The selectable impedance network may include a selectable capacitance in series with the coil to tune the performance of the inductive charging. The controller 130, 136 may generate a control signal to select the impedance value of the network. The parameter values may also be used to detect diagnostic conditions that may impact the vehicle charging process. For example, any parameter values outside of a predetermined range may be indicative of a component failure.

An advantage of the disclosed transformer parameter estimation system is that the transformer model parameters for the first coil and the second coil may be computed based on voltage and current measurements from only the first coil. The computations may be performed in a single controller so that measurements may be synchronized. This avoids measurement of currents or voltages for the second coil by a second controller that may not be synchronized with the measurements of the first coil.

Figure 3:
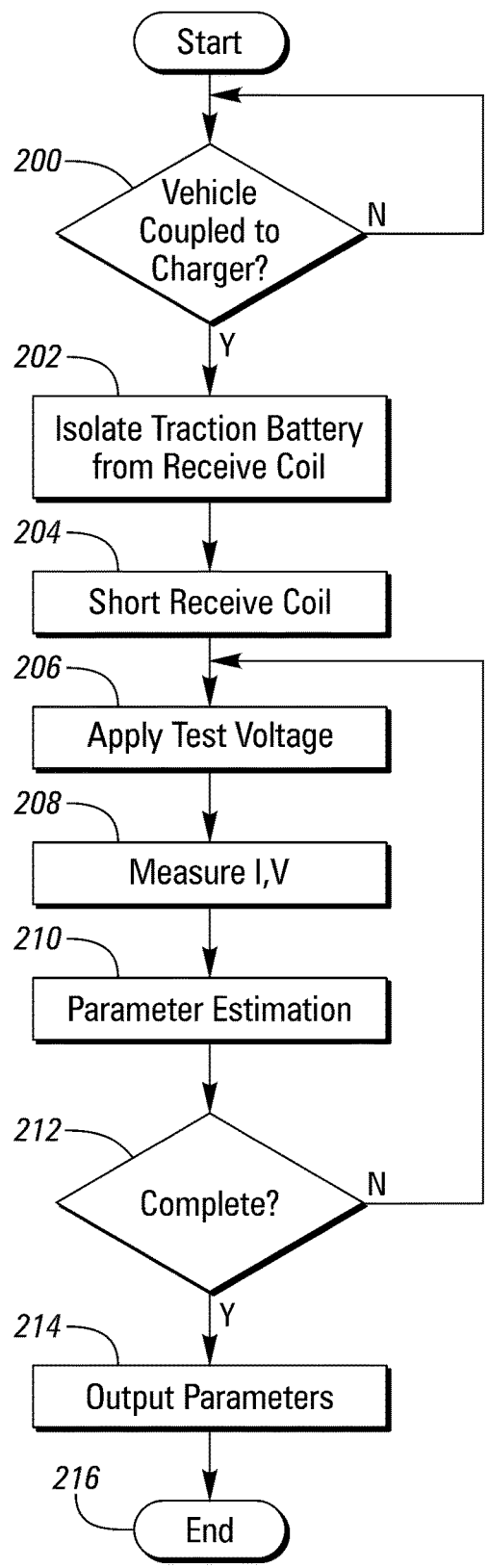
FIG. 3 is an example flowchart depicting operations for a vehicle charging system.

FIG. 3 depicts a possible sequence of operations for the transformer parameter estimation system as applied to a vehicle charging application that may be executed in one or more controllers 130, 136. At decision block 200, the logic may detect that the vehicle is coupled to the charging station. If the result is negative, the logic may be repeated. If the result is positive, then the logic may proceed as if the vehicle and the charging station are coupled. More generally, this check is to determine if the first coil and the second coil are in proximity to one another.

At operation 202, instructions may be executed to isolate the traction battery 24 from the receive coil 34. For example, the contactors 42 may be opened. In some configurations, an additional set of contactors may be included between the receive coil 34 and the power conversion module 32. At operation 204, instruction may be executed to short the terminals of the receive coil 34.

At operation 206, the test voltage may be applied to the transmit coil 40. The test voltage may cause a voltage and current in the receive coil 34. At operation 208, voltage and current signals are measured and stored for processing. At operation 210, instructions may be executed to perform the parameter estimations. For example, the Kalman filtering scheme described above may be implemented to obtain parameter estimates. At decision block 212, completion of the parameter estimation may be checked. Completion criteria may include a time duration and an estimation error being less than a threshold.

At operation 214, instructions may be executed to compute and output the final values of the parameters. For example, the Kalman filter parameters may be inserted into the appropriate equations and the equations may be solved for the final parameter values. The parameters may then be output to those modules and functions to control various features of the vehicle and charging station.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A transformer parameter estimation system comprising:
a first coil configured to be inductively coupled to a second coil such that parameters characterizing the first coil and the second coil change for each coupling; and
a controller programmed to command terminals of the second coil to be shorted and apply a test voltage as a square wave having a magnitude less than a nominal charging voltage to the first coil and estimate the parameters to reduce an error between a measured first coil current and an estimated first coil current based on voltage and current measurements from only the first coil and change an impedance coupled to the first coil based on the estimate.

2. The transformer parameter estimation system of claim 1 wherein the controller is further programmed to perform the commanding and applying for a predetermined duration.

3. The transformer parameter estimation system of claim 1 wherein the controller is further programmed to output the estimate of the parameters based on a Kalman filter configured to use the voltage and current measurements to update the estimate of the parameters to reduce the error between the measured first coil current and the estimated first coil current that is derived from a model defined by the parameters.

4. The transformer parameter estimation system of claim 1 wherein the parameters include a mutual inductance between the first coil and the second coil.

5. The transformer parameter estimation system of claim 1 wherein the parameters include a resistance of the first coil and a self-inductance of the first coil.

6. The transformer parameter estimation system of claim 1 wherein the parameters include a self-inductance of the second coil and a resistance of the second coil.

7. A vehicle charging system comprising:
a controller programmed to, responsive to detecting that a receive coil of a vehicle is proximate the transmit coil, estimate transmit coil and receive coil parameters based on voltage and current measurements from only the transmit coil while short circuiting the receive coil and applying, to the transmit coil, a square-wave test voltage with a magnitude less than a nominal charging voltage, and change a selectable impedance that is coupled to the transmit coil based on the parameters.

8. The vehicle charging system of claim 7 wherein the controller is further programmed to select an impedance value of a selectable impedance to increase a transfer of energy from the transmit coil to the receive coil.

9. The vehicle charging system of claim 7 wherein the controller is further programmed to select an impedance value of a second selectable impedance that is coupled to the receive coil based on the parameters to increase a transfer of energy from the transmit coil to the receive coil.

10. The vehicle charging system of claim 7 wherein the parameters include a mutual inductance between the transmit coil and the receive coil.

11. The vehicle charging system of claim 10 wherein the controller is further programmed to command a positioning mechanism coupled to the transmit coil based on the mutual inductance.

12. The vehicle charging system of claim 7 wherein the controller is further programmed to estimate the parameters based on a Kalman filter configured to use the voltage and current measurements to update the estimate of the parameters to reduce an error between the measured transmit coil current and an estimated transmit coil current that is derived from a model defined by the parameters.

13. The vehicle charging system of claim 7 wherein the parameters include a resistance of the transmit coil and a self-inductance of the transmit coil.

14. The vehicle charging system of claim 7 wherein the parameters include a self-inductance of the receive coil and a resistance of the receive coil.

15. A method comprising:
commanding, by a controller, a short circuit between terminals of a first coil;
applying a test voltage as a square wave having a magnitude less than a nominal charging voltage to a second coil loosely coupled to the first coil;
estimating, by the controller, parameters of the first coil and the second coil to reduce an error between a measured second coil current and an estimated second coil current based on voltage and current measurements from only the second coil; and
changing, by the controller, an impedance coupled to the second coil based on the parameters.

16. The method of claim 15 wherein the estimate of parameters includes a self-inductance of the first coil and a self-inductance of the second coil.

17. The method of claim 15 further comprising filtering the voltage and current measurement using a Kalman filter configured to use the voltage and current measurements to update the estimate of the parameters to reduce the error between the measured second coil current and the estimated second coil current that is derived from a model defined by the parameters.

18. The method of claim 15 wherein the test voltage is applied for a predetermined duration.

* * * * *